(12) United States Patent
Higashi et al.

(10) Patent No.: US 6,921,931 B2
(45) Date of Patent: Jul. 26, 2005

(54) ELECTROSTATIC DISCHARGE PROTECTION ELEMENT

(75) Inventors: Kenichi Higashi, Nara (JP); Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 38 days.

(21) Appl. No.: 10/458,736

(22) Filed: Jun. 11, 2003

(65) Prior Publication Data

US 2004/0027743 A1 Feb. 12, 2004

(30) Foreign Application Priority Data

Jun. 14, 2002 (JP) ........................................ 2002-174699

(51) Int. Cl.[7] .............................................. H01L 29/72
(52) U.S. Cl. ........................ 257/173; 257/175; 257/363
(58) Field of Search ................................. 257/173, 175, 257/363

(56) References Cited

U.S. PATENT DOCUMENTS 6,338,986 B1 * 1/2002 Kawazoe et al. ........... 438/133

6,524,893 B2  2/2003 Kawazoe et al.

FOREIGN PATENT DOCUMENTS

JP 11-204737 7/1999
JP 2001-267433 9/2001

* cited by examiner

Primary Examiner—Sara Crane
(74) Attorney, Agent, or Firm—Nixon & Vanderhye P.C.

(57) ABSTRACT

A the present invention provides an electrostatic discharge protection element to be used in a semiconductor integrated circuit providing MOSFET, comprising a thyristor and a trigger diode for triggering the thyristor into an ON-state, wherein the trigger diode provides an n-type cathode high concentration impurity region, a p-type anode high concentration impurity region and a gate formed between the two high concentration impurity regions, the gate being composed of the same material as that of a gate of MOSFET forming the semiconductor integrated circuit, and the thyristor provided with a p-type high concentration impurity region that forms a cathode and an n-type high concentration impurity region that forms an anode, and the p-type high concentration impurity region provides in a p well and connected to a resistor and/or the n-type high concentration impurity region provided in an n well and connected to a resistor.

21 Claims, 5 Drawing Sheets

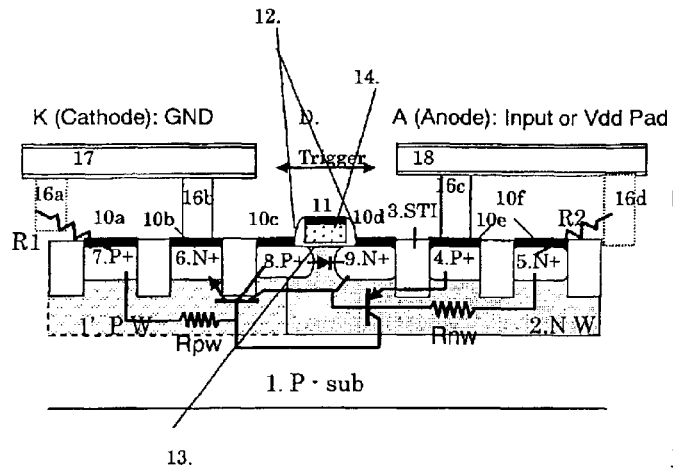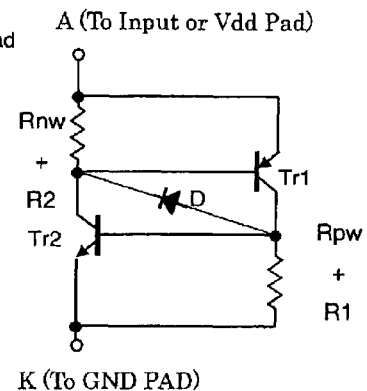
Fig 3(a)  Fig 3(b)
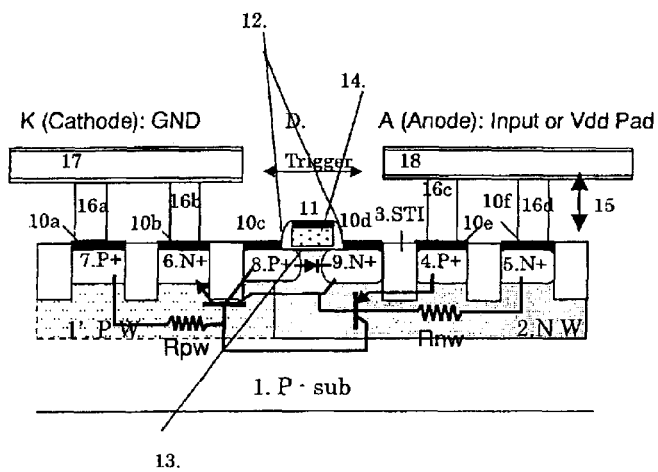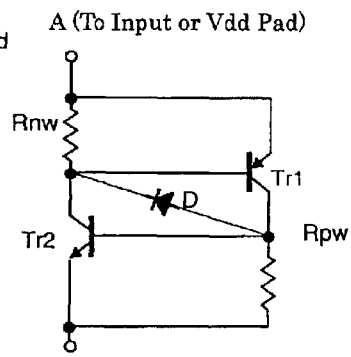
Fig 4(a)
prior art
Fig 4(b)
prior art

ELECTROSTATIC DISCHARGE PROTECTION ELEMENT

CROSS-REFERENCE TO RELATED APPLICATION

This application is related to Japanese application No. 2002-174699 filed on Jun. 14, 2002, whose priority is claimed under 35 USC § 119, the disclosure of which is incorporated by reference in its entirety.

BACKGROUND OF THE INVENTION

1. Field of the Invention

The present invention relates to an electrostatic discharge protection element. In particular, the present invention relates to the electrostatic discharge protection element that is provided in a semiconductor integrated circuit in order to protect the semiconductor integrated circuit from breakdown due to entrance of static electricity into the semiconductor integrated circuit from the outside or due to the phenomenon of electrostatic release to the outside from the charged semiconductor integrated circuit.

2. Description of the Background Art

The phenomena of charge of, or release of, static electricity, which are considered to be a problem when handling a semiconductor integrated circuit, are phenomena wherein the semiconductor integrated circuit becomes electrically charged when static electricity flows in from a charged mechanical apparatus or from a human being at the time the semiconductor integrated circuit is handled by the mechanical apparatus or human being and are phenomena wherein the semiconductor integrated circuit discharges static electricity to an external conductor after the semiconductor integrated circuit itself has become electrically charged due to vibration, friction, or the like, which occur at the time of conveyance. Static electricity is instantly charged to the semiconductor integrated circuit or is discharged from the semiconductor integrated circuit as a result of such electrostatic phenomena and, therefore, an excessive current flows through the semiconductor integrated circuit. Thus, an excessive voltage corresponding to this excessive current is applied to an internal circuit thereof. Therefore, junction breakdown, insulating film breakdown, wire blowout, or the like, occur inside the semiconductor integrated circuit and there is a risk wherein the semiconductor integrated circuit may be destroyed.

In general, an electrostatic discharge protection element is provided between an external terminal of the semiconductor integrated circuit and the internal circuit thereof in order to protect the semiconductor integrated circuit from breakdown due to static electricity and this becomes a detour for static electricity. Such the electrostatic discharge protection element is formed using a manufacturing process for forming the semiconductor integrated circuit. Here, it is desirable to form such the element without adding a specific manufacturing process to the manufacturing process for forming the semiconductor integrated circuit so that the manufacturing cost thereof is not increased.

The electrostatic discharge protection element has a structure wherein a current limiting element and a voltage clamp element are appropriately combined. A current limiting element is an element for limiting current that transiently flows through the semiconductor integrated circuit and a diffused resistor, a polycrystal silicon resistor, and the like, can be cited as examples thereof. On the other hand, a voltage clamp element is an element for suppressing the voltage applied to the internal circuit and a diode, a bipolar transistor, a MOS transistor, a thyristor, and the like, can be cited as examples thereof.

In particular, the thyristor has an advantage as the voltage clamp element that allows excessive current to flow. However, a trigger voltage for converting the thyristor, which is used for example with a power apparatus, to the ON-state so that current starts flowing is a high voltage and, therefore, the possibility of breakdown of the semiconductor integrated circuit before the thyristor turns on is very high. Therefore, it is necessary to reduce the trigger voltage Vtr.

FIG. 7 shows a schematic diagram of the I–V characteristics required for an SCR element, as the electrostatic discharge protection element, at the time of application of an electrostatic surge. In the figure the voltage wherein the SCR element starts avalanche breakdown is denoted as Vtr, the first breakdown voltage is denoted as Vt1 and the holding voltage is denoted as $V_H$. Here, the electrostatic discharge protection element (i) must have a withstand voltage (BVox) of an oxide film at the time of application of a surge that does not exceed first breakdown voltage (Vt1) in order to protect the gate oxide film of the internal circuit from breakdown due to electrostatic surge and (ii) must have holding voltage ($V_H$) exceed the maximum operational voltage (Vddmax) of the internal circuit in order to prevent the latching up of the circuit at the time of conventional operation.

A technology described in, for example, U.S. Pat. No. 6,524,893 is cited as the above described prior art and this is described below in reference to FIGS. 4(a) and 4(b). FIG. 4(a) shows a schematic cross sectional view and FIG. 4(b) shows an equivalent circuit diagram of FIG. 4(a). This technology relates to the electrostatic discharge protection element using the thyristor wherein reduction in the trigger voltage is achieved. The thyristor described in this gazette includes a trigger diode for triggering the thyristor into the ON-state at a low voltage. This trigger diode is provided with an n-type cathode high concentration impurity region 6, a p-type anode high concentration impurity region 4, a silicide layer formed on the surface of this n-type cathode high concentration impurity region 6, a silicide layer formed on the surface of this p-type anode high concentration impurity region 4 and a means (element isolation region) for electrically isolating the region 6 from the region 4 and, thereby, this trigger diode can be manufactured without adding any special processes, in particular a photography process, to the manufacturing process for the semiconductor integrated circuit, which includes the step of the formation of silicide, and without increase in the cost of manufacture. In FIG. 4(a), a p-type silicon substrate is denoted as 1, a p-type well is denoted as 1', an n-type well is denoted as 2, a shallow trench isolation (STI) is denoted as 3, an n-type anode high concentration impurity region is denoted as 5, a p-type cathode high concentration impurity region is denoted as 7, a p-type high concentration impurity region is denoted as 8, an n-type high concentration impurity region is denotes as 9, silicide layers are denoted as 10a to 10f and 11, sidewalls are denoted as 12, a gate oxide film is denoted as 13, a gate polysilicon is denoted as 14, an oxide film is denoted as 15, contacts are denoted as 16a to 16d, metal wires are denoted as 17 and 18, a trigger diode is denoted as D, the resistance of the n well is denoted as Rnw, the resistance of the p well is denoted as Rpw, a first transistor is denoted as Tr1 and a second transistor is denoted as Tr2.

When modern manufacturing processes are introduced in order to reduce the minimum processing dimensions, however, the power supply voltage for the operation of the semiconductor integrated circuit is lowered and short channel effects in the transistors easily occur. The impurity concentrations of the n wells and p well must be enhanced or the film thickness of the gate insulator films must be reduced in order to prevent this and, as a result, the insulation breakdown voltage of the gate insulating films is reduced.

Thus, enhancement in the concentration of the impurities in the two types of wells, together with the miniaturization of the transistors, leads to reduction in n well resistance Rnw and in p well resistance Rpw and, therefore, voltage Vtr, according to which the trigger diode for converting the thyristor to the ON-state starts operating, is reduced in the thyristor, which has a conventional structure.

The first breakdown voltage Vt1 determined by the amount of current flowing through the trigger diode, however, is uniquely determined in accordance with the well concentration and, therefore, it is difficult to adjust this first breakdown voltage Vt1.

Accordingly, it is desirable to make the first breakdown voltage Vt1, according to which the thyristor is converted to the ON-state, adjustable so that the thyristor can be manufactured according to any type of process as well as to lower the trigger voltage Vtr. Furthermore, it is also desirable to suppress unstable operation of the thyristor that occurs in the case wherein the gate potential of the trigger diode is in the floating condition.

SUMMARY OF THE INVENTION

Thus, the present invention provides an electrostatic discharge protection element to be used in a semiconductor integrated circuit providing MOSFET, comprising a thyristor and a trigger diode for triggering the thyristor into an ON-state, wherein the trigger diode provides an n-type cathode high concentration impurity region, a p-type anode high concentration impurity region and a gate formed between the two high concentration impurity regions, the gate being composed of the same material as that of a gate of MOSFET forming the semiconductor integrated circuit, and the thyristor provides a p-type high concentration impurity region that forms a cathode and an n-type high concentration impurity region that forms an anode, and the p-type high concentration impurity region provides in a p well and connected to a resistor and/or the n-type high concentration impurity region provided in an n well and connected to a resistor.

Furthermore, the present invention provides an electrostatic discharge protection element wherein the gate of the above described trigger diode is connected to a GND wire, a VDD wire or a signal wire for input or output.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3(a) and (b) are schematic view illustrating the electrostatic discharge protection element of embodiment 3.

FIGS. 4(a) and (b) are schematic view illustrating the electrostatic discharge protection element of prior art.

DESCRIPTION OF THE PREFERRED EMBODIMENTS

Figures 1A, 1B:
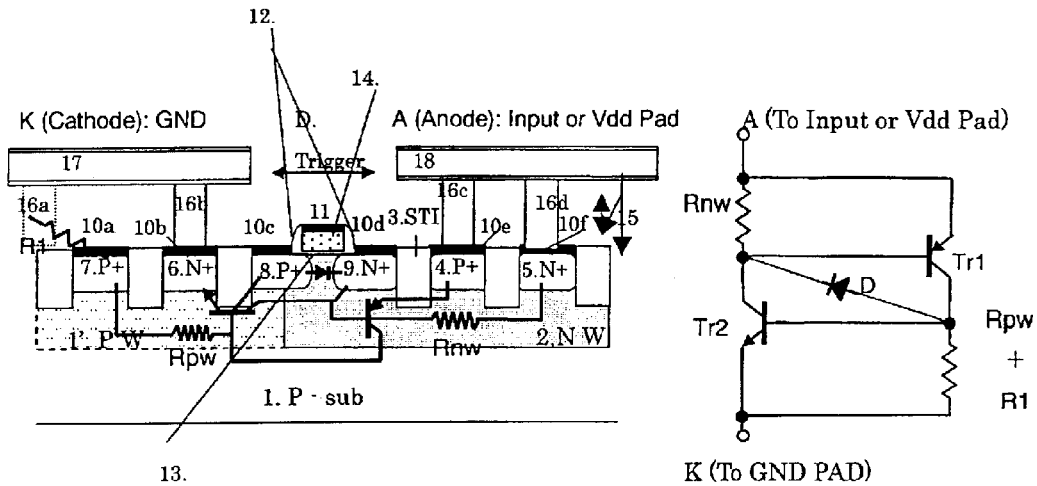
FIGS. 1(a) and (b) are schematic view illustrating the electrostatic discharge protection element of embodiment 1.

An electrostatic discharge protection element of the present invention is usually formed on a semiconductor substrate. A silicon substrate, a silicon germanium substrate, and the like, can be cited as the semiconductor substrate. These substrates may be of a p or of an n conductivity type. Boron, or the like, can be cited as impurities that provide the p-type and phosphorous, arsenic, or the like, can be cited as impurities that provide the n-type.

A semiconductor integrated circuit is formed in the semiconductor substrate. The type of the semiconductor integrated circuit is not particularly limited as long as MOSFETs are included therein. In addition to the MOSFET, a bipolar transistor, a capacitor, a resistor, and the like, can be cited as elements of a semiconductor integrated circuit.

The electrostatic discharge protection element is provided with, at least, a thyristor and a trigger diode for triggering the thyristor into the ON-state at a low voltage.

The trigger diode is provided with, at least, an n-type cathode high concentration impurity region, a p-type anode high concentration impurity region and a gate formed between the two high concentration impurity regions. The impurity concentration in the n-type cathode high concentration impurity region is appropriately set in accordance with the desired characteristics of the trigger diode. On the other hand, the impurity concentration in the p-type anode high concentration impurity region is appropriately set in accordance with the desired characteristics of the trigger diode.

The gate of the trigger diode has the same material as the gate of the MOSFET forming the semiconductor integrated circuit. Thereby, the gate of the trigger diode is formed in the same process for the gate of the MOSFET so that the number of manufacturing steps can be reduced.

Furthermore, it is preferable for the gate of the trigger diode to be connected to a GND wire, a VDD wire or a signal wire for input or output.

Next, the thyristor is provided with a p-type high concentration impurity region that forms the cathode and an n-type high concentration impurity region that forms the anode. The impurity concentration in the p-type high concentration impurity region is appropriately set in accordance with the desired characteristics of the thyristor. On the other hand, the impurity concentration in the n-type high concentration impurity region is appropriately set in accordance with the desired characteristics of the thyristor.

Furthermore, the p-type high concentration impurity region is formed in a p well and/or the n-type high concentration impurity region is formed in an n well according to the present invention. In addition, the high concentration impurity region(s) formed in the well(s) is/are connected to (a) resistor(s).

The impurity concentration in the p well is appropriately set in accordance with the desired characteristics of the thyristor. The impurity concentration in the n well is appropriately set in accordance with the desired characteristics of the thyristor.

It is preferable for the resistor(s) connected to the p-type high concentration impurity region and/or to the n-type high concentration impurity region to be made of polycrystal silicon, to be made of an n well in a p-type substrate in the case wherein the electrostatic discharge protection element is formed in the p-type substrate or to be made of a p well in an n-type substrate in the case wherein the electrostatic discharge protection element is formed in the n-type substrate. The resistor is selected from the above resistors and, thereby, the base voltage of Tr1 or Tr2 shown in FIG. 6(b), for example, can be controlled by this/these resistor(s).

In the following, the present invention is described in detail based on the embodiments.

Though embodiments using p-type semiconductor substrates that contain boron of low concentration are described below in the embodiments of the present invention, the descriptions below can of course be applied to semiconductor substrates that contain other impurities and to n-type semiconductor substrates.

Embodiment 1

FIG. 1(a) is a cross sectional view for describing the structure of a thyristor having a trigger diode that is an electrostatic discharge protection element according to Embodiment 1 of the present invention. FIG. 1(b) is an equivalent circuit diagram of FIG. 1(a).

An n-type well 2 is formed in a p-type silicon substrate 1. A p-type anode high concentration impurity region 4 and an n-type anode high concentration impurity region 5 are formed are formed on the surface of the n-type well 2. A p-type cathode high concentration impurity region 7 and an n-type cathode high concentration impurity region 6 are formed on the surface of a p-type well 1', which is located at a distance away from the n-type well 2. Silicide layers 10a to 10f are formed on the respective surfaces of the p-type anode high concentration impurity region 4, n-type anode gate high concentration impurity region 5, the p-type cathode gate high concentration impurity region 7 and the n-type cathode high concentration impurity region 6 and are connected to metal wires 17 and 18 via contacts 16a to 16d.

On the other hand, a trigger diode D for triggering the thyristor operation is formed of a p-type high concentration impurity region 8, which becomes the anode of trigger diode D, an n-type high concentration impurity region 9, which becomes the cathode and the n-type well 2. A gate oxide film 13, which forms the gate portion of a MOS transistor in the semiconductor integrated circuit, a gate polysilicon (gate electrode) 14 and sidewall spacers 12 made of insulators exist the above p-type high concentration impurity region 8, which becomes the anode of trigger diode D and the above n-type high concentration impurity region 9, which becomes the cathode. A silicide layer 11, which has been formed at the same time as silicide layers 10a to 10f on the silicon in the salicide process for the semiconductor integrated circuit, is located on top of the gate polysilicon 14. No silicide layers are formed on the surfaces of sidewall spacers 12 and, therefore, the p-type high concentration impurity region 8 of trigger diode D and the n-type high concentration impurity region 9, which becomes the cathode, are not short circuited through a silicide layer.

In Embodiment 1, a resistor R1 made of polysilicon, an n well, or the like, is added to the above described structure and is placed between the silicide layer 10a and the metal wire 17 in order to control the first breakdown voltage, as shown in FIG. 1(a).

Figures 8A, 8B:
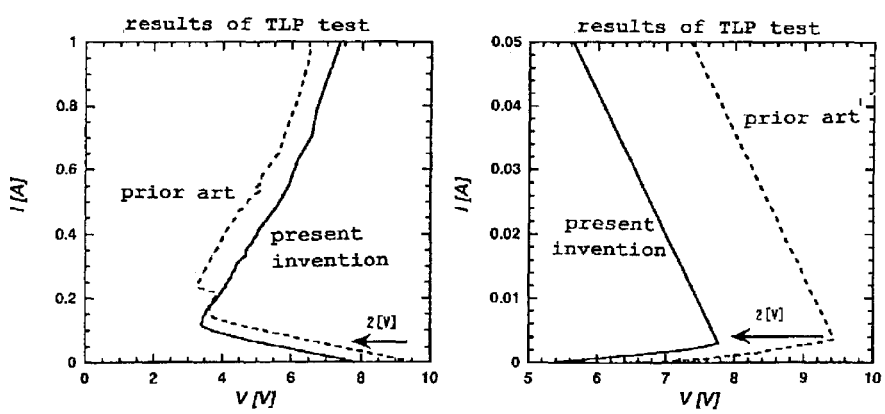
FIGS. 8(a) and (b) are graphs showing the results of a TPL test of the electrostatic discharge protection element of embodiment 1 and prior art.

Here, FIGS. 8(a) and 8(b) show the results of a TPL test (Transmission Line Pulse test) in the case wherein resistor R1 placed between the silicide layer 10a and the metal wire 17 is set at 40 Ω and the total resistance (Rpw+Rnw) of the p-type well 1' and the n-type well 2 is set at 30 Ω. FIG. 8(b) is an enlarged graph of FIG. 8(a). Here, the I–V characteristics at the time when a pulse is applied between the cathode and the anode are determined according to this test, which is, in general, used for an evaluation of the characteristics of a thyristor. As is clear from FIG. 8(a), it is understood that the first breakdown voltage is lowered by approximately 2V from 9.5V in the prior art wherein there are no resistors to 7.5V in Embodiment 1 wherein a resistor is provided.

Embodiment 2

Figures 2A, 2B:
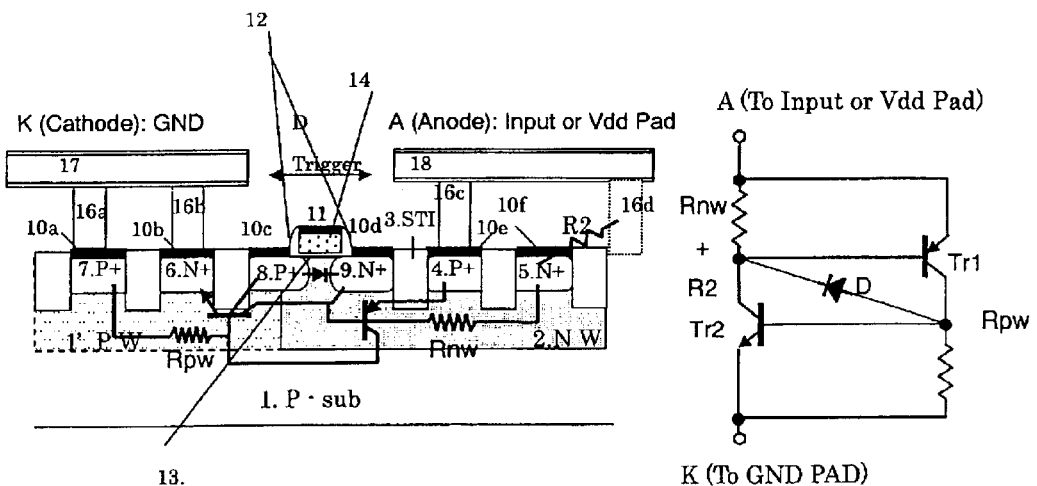
FIGS. 2(a) and (b) are schematic view illustrating the electrostatic discharge protection element of embodiment 2.

FIG. 2(a) according to the second embodiment of the present invention is a cross sectional view for describing the structure, which is a modification of that of FIG. 1(a), of a thyristor having a trigger diode, which is an electrostatic discharge protection element, wherein a resistor R2 made of polysilicon, an n well, or the like, is located between a silicide layer 10f and a metal wire 18. FIG. 2(b) is an equivalent circuit diagram of FIG. 2(a).

Embodiment 3

Furthermore, FIG. 3(a) shows the third embodiment of the present invention, wherein resistors (R1 and R2) made of polysilicon, an n well, or the like, are both placed between a silicide layer 10a and a metal wire 17 as well as between a silicide layer 10f and a metal wire 18. FIG. 3(b) is an equivalent circuit diagram of FIG. 3(a).

Though the cases wherein the gate potentials of the gates of the trigger diodes are in the floating condition in the same manner as in the prior art are described in the above described Embodiments 1 to 3, other types of embodiments wherein the gate potentials are fixed are described in the following.

Embodiment 4

Figures 5A, 5B:
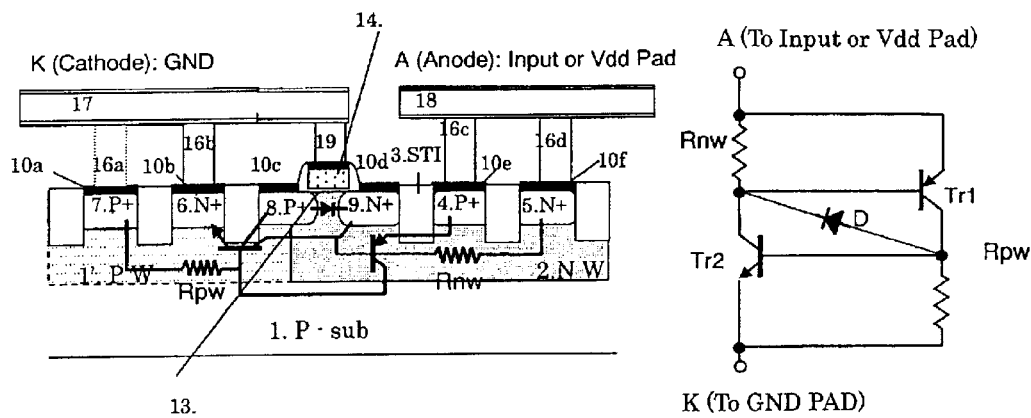
FIGS. 5(a) and (b) are schematic view illustrating the electrostatic discharge protection element of embodiment 4.

FIG. 5(a) shows the fourth embodiment of the present invention wherein a gate polysilicon 14 of the trigger diode is connected to a metal wire 17 on the cathode side while the remaining parts of the structure are the same as in the prior art of FIG. 4(a). That is to say, the gate polysilicon 14 of the trigger diode is in the floating condition in the prior art of FIG. 4(a) while the gate polysilicon 14 of the trigger diode is connected to the GND terminal so that the potential is fixed in Embodiment 4. FIG. 5(b) is an equivalent circuit diagram of FIG. 5(a).

Figure 9:
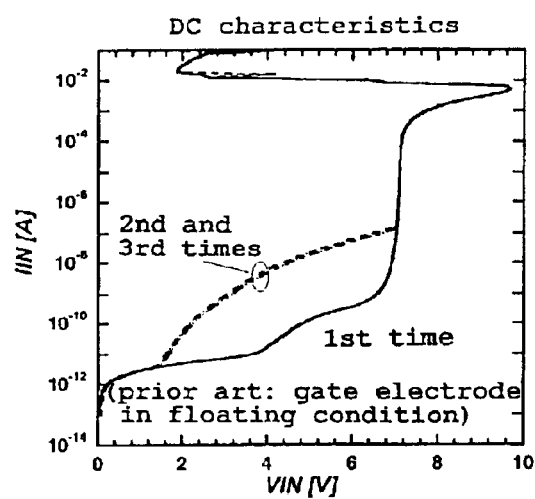
FIG. 9 is a graph showing the result of a TPL test of structure of prior art.
Figure 10:
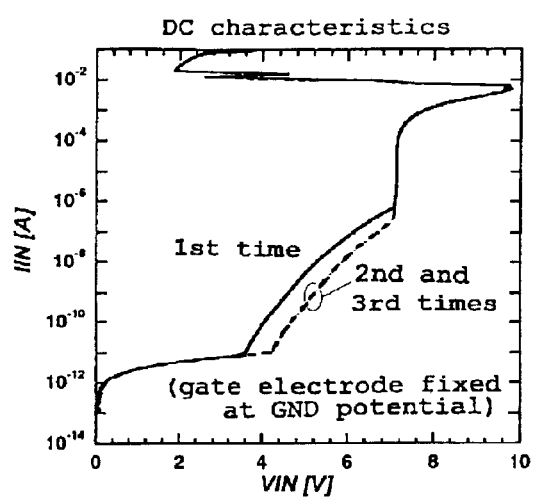
FIG. 10 is a graph showing the result of a TPL test in the case wherein the gate electrode of the trigger diode is fixed at the GND potential according to the Embodiment 4.

The effects thereof are described in reference to FIGS. 9 and 10. Here, FIG. 9 shows the result of the TPL test in the conventional structure while FIG. 10 shows the case wherein the gate electrode of the trigger diode is fixed at the GND potential according to the Embodiment 4. Here, the voltages in FIGS. 9 and 10 represent the average values gained by sweeping a current from 0 A to 100 mA three times in sequence through the electrostatic discharge protection element.

FIG. 9 shows a change in the V–I characteristic at the time when a voltage is applied through both terminals of the thyristor for the first time and at the time of the voltage application for the second time. That is to say, an increase in the leak current (100 times, or higher, at 3.5V) is observed in FIG. 9, while suppression of such an increase in the leak current is implemented in Embodiment 4 (FIG. 10).

The gate electrode of the trigger diode is in the floating condition in FIG. 9 and, therefore, it is considered that some defects are caused in the gate oxide film due to voltage stress. On the other hand, the gate electrode of the trigger diode is fixed as shown in FIG. 10 in Embodiment 4 and, therefore, the gate oxide film receives almost no effects. That is to say, it is understood that the operation of the thyristor having the structure of Embodiment 4 becomes stable.

Here, though an example wherein the gate electrode of the trigger diode is fixed at the GND potential is described in the above, the same effects can be gained even in the case wherein the fixture of the potential of the gate electrode is carried out at the VDD voltage or through the connection to the signal wire for input or output.

Embodiment 5

Figures 6A, 6B:
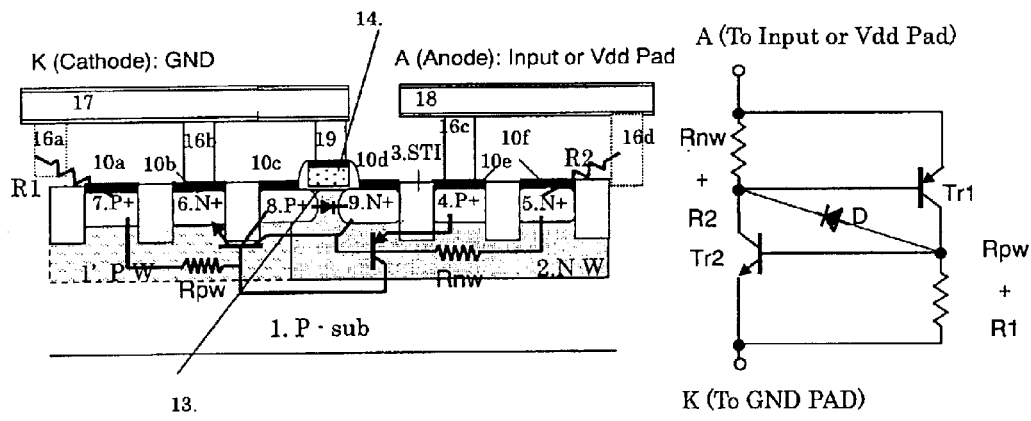
FIGS. 6(a) and (b) are schematic view illustrating the electrostatic discharge protection element of embodiment 5.
Figure 7:
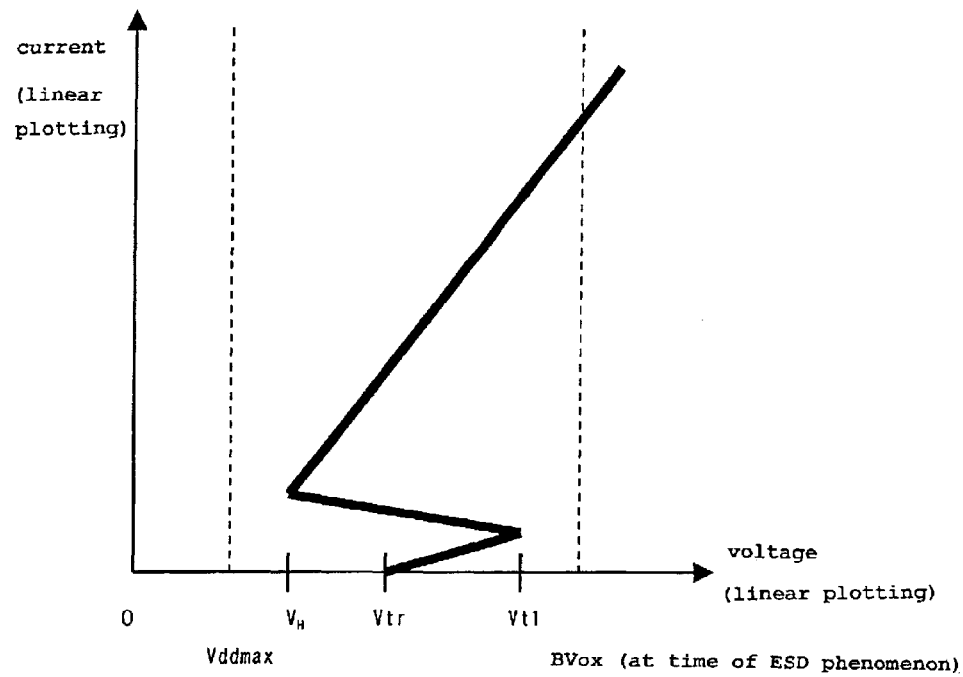
FIG. 7 is a schematic diagram of the I–V characteristics required for an SCR element, as the electrostatic discharge protection element, at the time of application of an electrostatic surge.

Furthermore, FIG. 6(a) shows the fifth embodiment as another embodiment of the present invention. FIG. 6(a) shows the structure wherein the above described third embodiment and fourth embodiment are combined. In this structure it becomes possible to reduce the first breakdown voltage Vt1 of the thyristor and to achieve stable operation. FIG. 6(b) shows an equivalent circuit diagram of FIG. 6(a).

Here, in the above description a p-type well 1' having an impurity concentration higher than a p-type silicon substrate 1 is formed in the CMOS semiconductor integrated circuit in a region other than the region wherein an n-type well is located in a p-type substrate 1. However, a thyristor that is triggered at a low voltage can, of course, be gained in the structure wherein a p-type well 1' is not formed, though this is not shown.

The resistors, for controlling the above described first breakdown voltage, made of polysilicon, n wells, or the like, located between a silicide layer 10a and a metal wire 17 or between a silicide layer 10f and a metal wire 18 are manufactured at the same time that gate electrodes are formed and at the same time that n wells are formed, respectively. Therefore, no additional process is added to the all manufacturing process for forming the semiconductor integrated circuit so that the manufacturing cost thereof is not increased.

According to the present invention the I–V characteristics required for the SCR element, as an electrostatic discharge protection element at the time of application of an electrostatic surge, in particular, the reduction in the first breakdown voltage, can easily be realized by inserting (a) resistor (s) into the diffusion layer(s) of the cathode, of the anode, or of both. In addition, it becomes possible to suppress leak current and to realize the stable thyristor operation by fixing the gate electrode of the trigger diode at the GND potential.

What is claimed is:

1. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed at least partially between the two high concentration impurity regions as viewed from above, the gate being composed of the same material as that of a gate of the MOSFET of the semiconductor integrated circuit, wherein the thyristor comprises a p-type high concentration impurity region that forms a cathode provided in a p well and wherein the p-type high concentration impurity region is connected to a resistor, and an n-type high concentration impurity region that forms an anode, and wherein the resistor is electrically connected between the p-type high concentration impurity region of the thyristor and a metal inclusive conductive wiring located at least partially over the thyristor.

2. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed between the two high concentration impurity regions, the gate being composed of the same material as that of a gate of the MOSFET of the semiconductor integrated circuit, and wherein the thyristor comprises a p-type high concentration impurity region that forms a cathode, and an n-type high concentration impurity region that forms an anode provided in an n well, the n-type high concentration impurity region that forms the anode being connected to a resistor so that the resistor is electrically connected between the n-type high concentration impurity region of the thyristor and a metal inclusive conductive wiring located at least partially over the thyristor.

3. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed between the two high concentration impurity regions, the gate being composed of the same material as that of a gate of the MOSFET of the semiconductor integrated circuit, and wherein the thyristor comprises a p-type high concentration impurity region that forms a cathode provided in an p well and connected to a resistor, and an n-type high concentration impurity region that forms an anode provided in an n well and connected to a resistor, wherein at least one of the resistors is electrically connected to a conductive wiring located at least partially over the thyristor.

4. An electrostatic discharge protection element of claim 1, wherein the resistor is selected from a polycrystal silicon, an n well in a p-type substrate in the case wherein the electrostatic discharge protection element is formed in the p-type substrate and a p well in an n-type substrate in the case wherein the electrostatic discharge protection element is formed in the n-type substrate.

5. An electrostatic discharge protection element of claim 1, wherein the gate of the above described trigger diode is connected to a GND wire, a VDD wire or a signal wire for input or output.

6. An electrostatic discharge protection element of claim 1, wherein the electrostatic discharge protection element and the semiconductor integrated circuit are formed on one substrate but in different regions from each other.

7. An electrostatic discharge protection element of claim 2, wherein the resistor is selected from a polycrystal silicon, an n well in a p-type substrate in the case wherein the electrostatic discharge protection element is formed in the p-type substrate and a p well in an n-type substrate in the case wherein the electrostatic discharge protection element is formed in the n-type substrate.

8. An electrostatic discharge protection element of claim 2, wherein the gate of the above described trigger diode is connected to a GND wire, a VDD wire or a signal wire for input or output.

9. An electrostatic discharge protection element of claim 2, wherein the electrostatic discharge protection element and the semiconductor integrated circuit are formed on one substrate but in different regions from each other.

10. An electrostatic discharge protection element of claim 3, wherein the resistor is selected from a polycrystal silicon, an n well in a p-type substrate in the case wherein the electrostatic discharge protection element is formed in the p-type substrate and a p well in an n-type substrate in the case wherein the electrostatic discharge protection element is formed in the n-type substrate.

11. An electrostatic discharge protection element of claim 3, wherein the gate of the above described trigger diode is connected to a GND wire, a VDD wire or a signal wire for input or output.

12. An electrostatic discharge protection element of claim 3, wherein the electrostatic discharge protection element and the semiconductor integrated circuit are formed on one substrate but in different regions from each other.

13. The electrostatic discharge protection element of claim 1, wherein the gate of the trigger diode is grounded.

14. The electrostatic discharge protection element of claim 2, wherein the gate of the trigger diode is grounded.

15. The electrostatic discharge protection element of claim 3, wherein the gate of the trigger diode is grounded.

16. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed at least partially between the two high concentration impurity regions as viewed from above, the gate being composed of the same material as that of a gate of the MOSFET of the semiconductor integrated circuit, wherein the thyristor comprises a p-type high concentration impurity region that forms a cathode provided in a p well and wherein the p-type high concentration impurity region is connected to a resistor, and an n-type high concentration impurity region that forms an anode, and wherein the gate of the trigger diode is connected to a GND wire, a VDD wire or a signal wire for input or output.

17. The electrostatic discharge protection element of claim 16, wherein the gate of the trigger diode is grounded.

18. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed between the two high concentration impurity regions, the gate being composed of the same material as that of a gate of the MOSFET of the semiconductor integrated circuit, wherein the thyristor comprises a p-type high concentration impurity region that forms a cathode, and an n-type high concentration impurity region that forms an anode provided in an n well, the n-type high concentration impurity region that forms the anode being connected to a resistor, and wherein the gate of the trigger diode is connected to a GND wire, a VDD wire or a signal wire for input or output.

19. The electrostatic discharge protection element of claim 18, wherein the gate of the trigger diode is grounded.

20. An electrostatic discharge protection element to be used in a semiconductor integrated circuit comprising a MOSFET, the electrostatic discharge protection element comprising:

a thyristor and a trigger diode for triggering the thyristor into an ON-state, wherein the trigger diode comprises an n-type cathode high concentration impurity region, a p-type anode high concentration impurity region and a gate formed between the two high concentration impurity regions, the gate being composed of the same material as that of a gate of the MOSFET of the semiconductor integrated circuit, wherein the thyristor comprises a p-type high concentration impurity region that forms a cathode provided in an p well and connected to a resistor, and an n-type high concentration impurity region that forms an anode provided in an n well and connected to a resistor, and wherein the gate of the trigger diode is connected to a GND wire, a VDD wire or a signal wire for input or output.

21. The electrostatic discharge protection element of claim 20, wherein the gate of the trigger diode is grounded.

* * * * *